United States Patent
Chen et al.

(10) Patent No.: US 11,302,547 B2
(45) Date of Patent: *Apr. 12, 2022

(54) CARRIER STRUCTURE AND MICRO DEVICE STRUCTURE

(71) Applicant: PlayNitride Display Co., Ltd., MiaoLi County (TW)

(72) Inventors: Pei-Hsin Chen, MiaoLi County (TW); Yi-Chun Shih, MiaoLi County (TW); Yi-Ching Chen, MiaoLi County (TW); Ying-Tsang Liu, MiaoLi County (TW); Yu-Chu Li, MiaoLi County (TW); Huan-Pu Chang, MiaoLi County (TW); Tzu-Yang Lin, MiaoLi County (TW); Yu-Hung Lai, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 118 days.

This patent is subject to a terminal disclaimer.

Patent file contains an affidavit/declaration under 37 CFR 1.130(b).

(21) Appl. No.: 16/581,777

(22) Filed: Sep. 25, 2019

(65) Prior Publication Data
US 2020/0185243 A1   Jun. 11, 2020

(30) Foreign Application Priority Data
Dec. 5, 2018   (TW) .................................. 107143610

(51) Int. Cl.
*H01L 25/07*   (2006.01)
*H01L 21/673*   (2006.01)
*H01L 25/13*   (2006.01)
*H01L 25/075*   (2006.01)

(52) U.S. Cl.
CPC .. H01L 21/67333 (2013.01); H01L 21/67336 (2013.01); *H01L 25/0753* (2013.01); *H01L 25/13* (2013.01); *H01L 2221/68304* (2013.01); *H01L 2221/68368* (2013.01)

(58) Field of Classification Search
None
See application file for complete search history.

(56) References Cited

U.S. PATENT DOCUMENTS

2017/0047306 A1* 2/2017 Meitl ..................... H01L 24/95
2020/0321229 A1* 10/2020 Lee ........................ B65G 47/90

FOREIGN PATENT DOCUMENTS

| CN | 107680983 | | 2/2018 | |
| CN | 108389825 | | 8/2018 | |
| KR | 10-2018-0069255 | * | 6/2018 | ....... H01L 21/67144 |

* cited by examiner

*Primary Examiner* — Ronald P Jarrett
(74) *Attorney, Agent, or Firm* — JCIPRNET

(57) ABSTRACT

A carrier structure suitable for transferring or supporting a plurality of micro devices includes a carrier and a plurality of transfer units. The carrier has a carrier surface and a plurality of recesses disposed on the carrier surface. The transfer units are respectively disposed in the recesses and a plurality of transferring surfaces are exposed. Each micro device has a device surface. The transferring surface of each transfer unit is configured to be connected to the device surface of the corresponding micro device. A micro device structure including the carrier structure is also provided.

16 Claims, 11 Drawing Sheets

CARRIER STRUCTURE AND MICRO DEVICE STRUCTURE

CROSS-REFERENCE TO RELATED APPLICATION

This application claims the priority benefit of Taiwan application serial no. 107143610, filed on Dec. 5, 2018. The entirety of the above-mentioned patent application is hereby incorporated by reference herein and made a part of this specification.

BACKGROUND

Technical Field

The disclosure relates to a carrier structure and a micro device structure, and particularly relates to a carrier structure suitable for transferring or supporting a micro device and a micro device structure using the carrier structure.

Related Art

In recent years, under the circumstances that organic light-emitting diode (OLED) display panels generally have high manufacturing cost and their lifetime cannot compete with current mainstream displays, micro light-emitting diode (LED) displays gradually attract investment from various technology companies. The micro LED displays have optical performance equivalent to that of the OLED display technology, such as high color saturation, fast response speed and high contrast, and have advantages such as low energy consumption and long material life. However, in the current technology, the manufacturing cost of the micro LED displays is still higher than that of the OLED displays. The main reason lies in that, in a manufacturing technique of the micro LED displays, a die transfer method is adopted in which fabricated micro LED dies are directly transferred onto a driving circuit backplane. Although such a mass transfer technique has development advantages in the manufacture of large-size products, the related processing techniques and equipment all have bottlenecks to be broken. Extraction methods used in current die transfer techniques include a method using an electrostatic force, a method using a van der Waals force, a method using a viscous material and so on. Among them, the method using the electrostatic force requires a higher applied voltage and has a higher risk of causing arcing and dielectric breakdown. When the method using the van der Waals force is used to extract the dies, adhesion force and desorption force of the dies vary depending on a speed at which an elastomer polymer stamper contacts the dies. Therefore, more precise control is needed for the operation of the stamper and the success rate of transfer is not high. The transfer method that sticks the dies by the viscous material has disadvantages such as non-uniform adhesion force, instability and poor alignment accuracy. In addition, when the dies are arranged on a transfer carrier through a support structure, since the support structure is generally disposed on peripheral surfaces of the dies, the dies cannot be densely arranged on the transfer carrier to efficiently perform mass transfer. Therefore, how to solve the above technical bottlenecks and reduce the production cost is one of the issues that the various technology companies are currently working on.

SUMMARY

The disclosure provides a carrier structure having good supporting performance.

The disclosure provides a micro device structure with good supporting force for micro devices.

A carrier structure of the disclosure is suitable for transferring or supporting a plurality of micro devices. The carrier structure includes a carrier and a plurality of transfer units. The carrier has a carrier surface and a plurality of recesses located on the carrier surface. The transfer units are respectively disposed in the recesses and a plurality of transferring surfaces are exposed. Each of the micro devices has a device surface, and the transferring surface of each of the transfer units is configured to be connected to the device surface of the corresponding micro device.

In an embodiment of the disclosure, in the carrier structure, the transferring surface is aligned with the carrier surface.

In an embodiment of the disclosure, in the carrier structure, the transferring surface protrudes from the carrier surface.

In an embodiment of the disclosure, in the carrier structure, a ratio of a height by which the transferring surface protrudes from the carrier surface to a height of the transfer unit is less than or equal to 0.8.

In an embodiment of the disclosure, in the carrier structure, a ratio of a spacing between any two adjacent recesses to a width of each of the micro devices is less than or equal to 0.5.

A micro device structure of the disclosure includes a carrier structure and a plurality of micro devices. The carrier structure includes a carrier and a plurality of transfer units. The carrier has a carrier surface and a plurality of recesses located on the carrier surface. The transfer units are respectively disposed in the recesses. Each of the micro devices has a device surface. A transferring surface of each of the transfer units is connected to the device surface of the corresponding micro device.

In an embodiment of the disclosure, in the micro device structure, the transferring surface is aligned with the carrier surface.

In an embodiment of the disclosure, in the micro device structure, the transferring surface protrudes from the carrier surface.

In an embodiment of the disclosure, in the micro device structure, a ratio of a height by which the transferring surface protrudes from the carrier surface to a height of the transfer unit is less than or equal to 0.8.

In an embodiment of the disclosure, in the micro device structure, a Young's modulus of each of the transfer units is less than a Young's modulus of the carrier and a Young's modulus of the corresponding micro device.

In an embodiment of the disclosure, in the micro device structure, a ratio of area of the transferring surface of each of the transfer units to area of the device surface of the corresponding micro device is greater than or equal to 0.2 and less than or equal to 1.5.

In an embodiment of the disclosure, in the micro device structure, the transferring surface of each of the transfer units has a contact surface with the device surface of the corresponding micro device. A ratio of area of the contact surface to the area of the device surface is greater than or equal to 0.2.

In an embodiment of the disclosure, in the micro device structure, each of the transfer units includes a plurality of transfer parts.

In an embodiment of the disclosure, in the micro device structure, each of the transfer parts includes a sub transferring surface connected to the device surface of the corresponding micro device. Each sub transferring surface is smaller than the device surface of the corresponding micro device.

In an embodiment of the disclosure, in the micro device structure, an orthographic projection of the transfer parts of each of the transfer units on the carrier is defined as a transfer region. A ratio of area of the transfer region to the area of the device surface of the corresponding micro device is greater than or equal to 0.2 and less than or equal to 1.5.

In an embodiment of the disclosure, in the micro device structure, a ratio of a spacing between any two adjacent recesses to a width of each of the micro devices is less than or equal to 0.5.

Based on the above, in the carrier structure and the micro device structure of embodiments of the disclosure, by disposing the transfer unit in the corresponding recess of the carrier, the transfer unit can be uniformly heated, so as to improve transfer (or supporting) uniformity and the supporting force of the carrier structure with respect to a plurality of micro devices.

To make the above features and advantages of the disclosure more comprehensible, examples accompanied with drawings are described in detail as follows.

DESCRIPTION OF THE EMBODIMENTS

Figure 1:
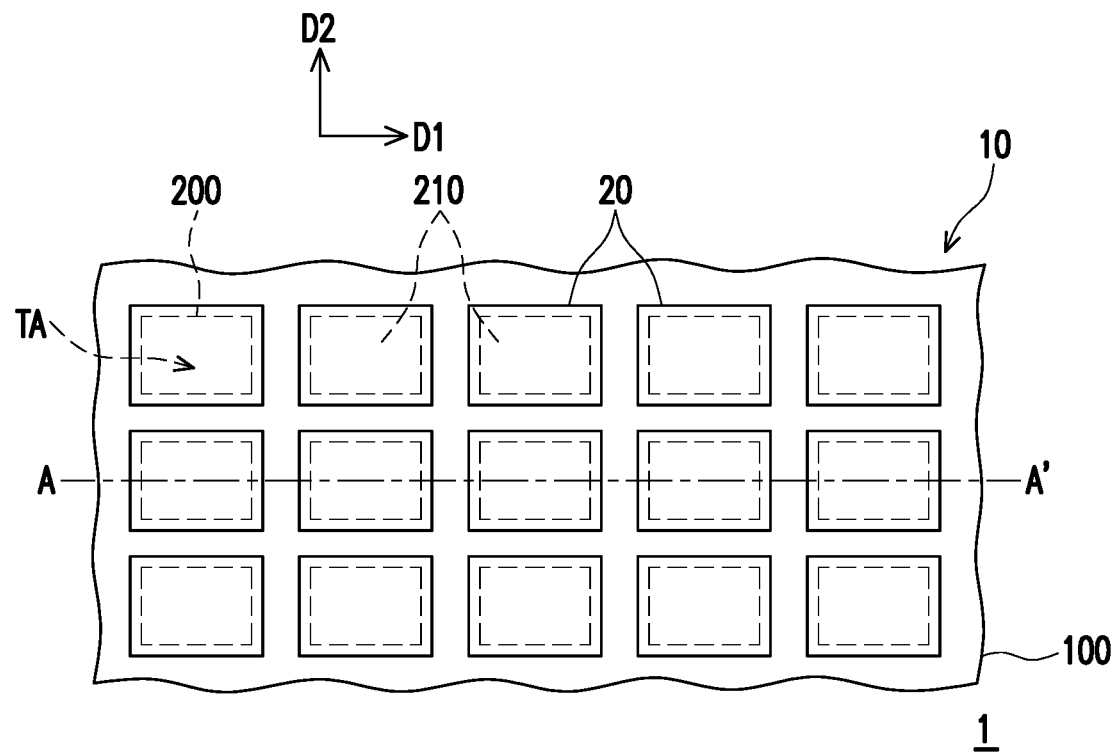
FIG. 1 is a schematic bottom view of a micro device structure according to a first embodiment of the disclosure.

Reference will now be made in detail to exemplary embodiments of the disclosure, examples of which are illustrated in the accompanying drawings. Wherever possible, the same reference numerals are used in the drawings and the description to refer to the same or similar parts.

Figure 2A:
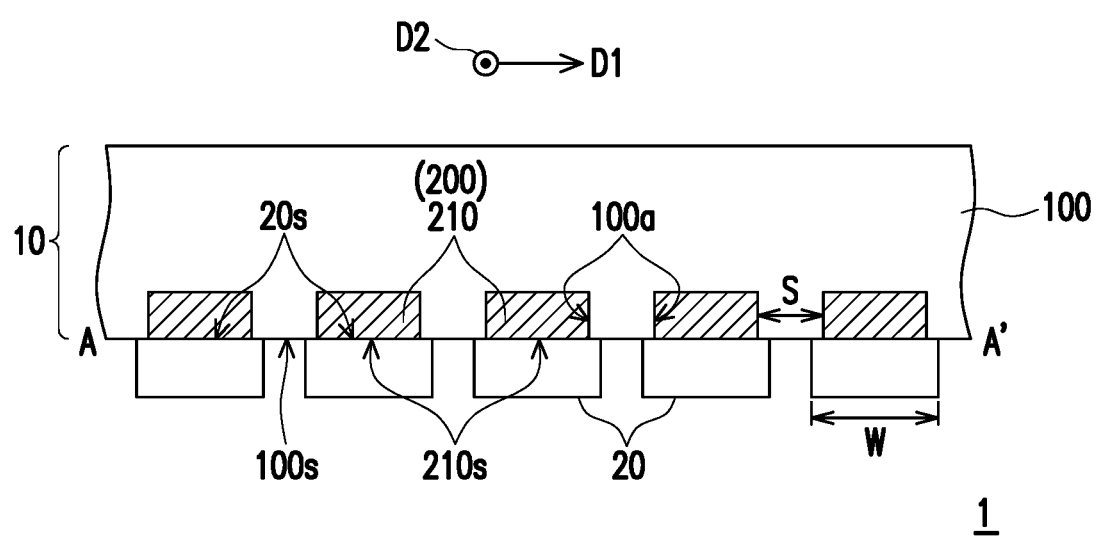
FIG. 2A is a schematic cross-sectional view of the micro device structure of FIG. 1.
Figure 2B:
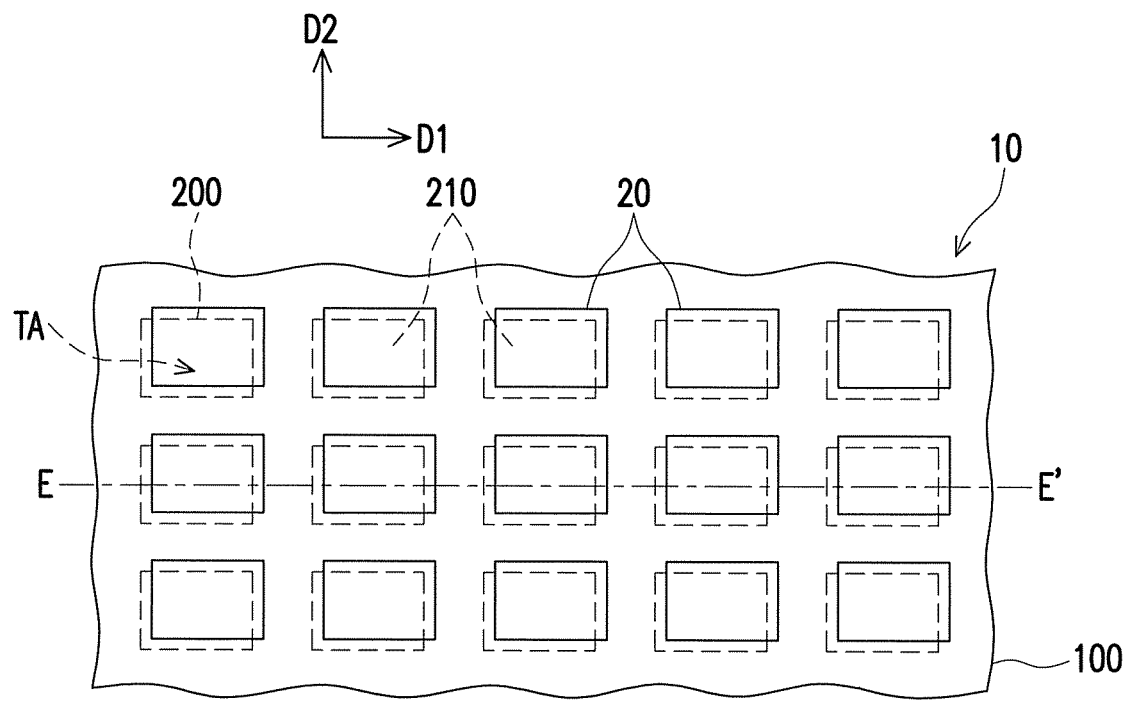
FIG. 2B is a schematic bottom view of a micro device structure according to an embodiment of the disclosure.
Figure 2C:
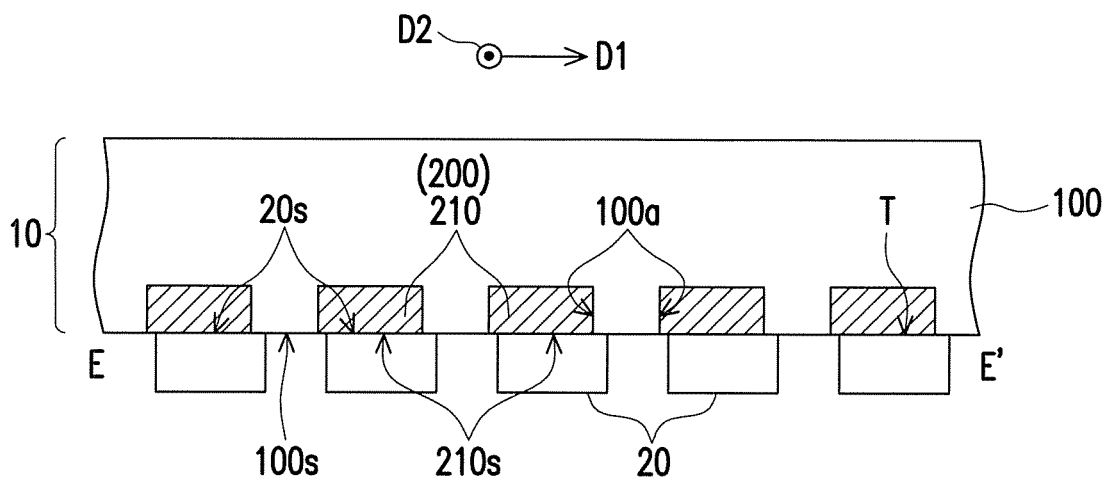
FIG. 2C is a schematic cross-sectional view of the micro device structure of FIG. 2B.

FIG. 1 illustrates a micro device structure 1 of a first embodiment of the disclosure. FIG. 2A is a schematic cross-sectional view of the micro device structure 1 of FIG. 1. Particularly, FIG. 2A corresponds to a section line A-A' of FIG. 1. FIG. 2B is a schematic bottom view of a micro device structure according to an embodiment of the disclosure. FIG. 2C is a schematic cross-sectional view of a micro device structure of FIG. 2B.

Referring to FIG. 1 and FIG. 2A, the micro device structure 1 includes a carrier structure 10, a plurality of transfer units 200 and a plurality of micro devices 20. The carrier structure 10 is suitable for transferring or supporting the micro devices 20. The carrier structure 10 includes a carrier 100 and the transfer units 200. The carrier 100 has a surface 100s and a plurality of recesses 100a located on the surface 100s of the carrier 100. In the present embodiment, the transfer units 200 may be arranged in an array on the surface 100s of the carrier 100, and each transfer unit 200 may selectively have only one transfer part 210. However, the disclosure is not limited thereto. A plurality of transfer parts 210 of the transfer units 200 are respectively disposed in the recesses 100a of the carrier 100, and each expose a transferring surface with respect to the surface 100s of the carrier 100. Specifically, in the present embodiment, each transfer part 210 may be conformally disposed in the corresponding recess 100a. However, the disclosure is not limited thereto.

It is to be noted that an orthographic projection of each transfer part 210 (or recess 100a) on the carrier 100 may selectively be rectangular, circular, elliptical, or of other suitable shape. For example, in the present embodiment, the orthographic projection of each transfer part 210 (or recess 100a) on the carrier 100 is rectangular and has a maximum dimension in a direction D1. However, the disclosure is not limited thereto. According to other embodiments, each transfer part 210 may also have the maximum dimension in a direction D2. Particularly, in the present embodiment, the maximum dimension may be less than or equal to 30 µm. In an embodiment, the maximum dimension of each transfer part 210 may be less than or equal to 10 µm. It is worth mentioning that, by adjusting the size of the transfer part 210 (or recess 100a), a connection force between each transfer unit 200 and the micro device 20 can be changed in magnitude to satisfy different supporting requirements. Herein, a ratio of a spacing S between any two adjacent transfer parts 210 to a width W of each micro device 20 is less than or equal to 0.5. If greater than 0.5, excessive space of the carrier 100 may be occupied, such that the micro device 20 cannot be densely arranged on the carrier 100.

In the present embodiment, each micro device 20 has a device surface 20s, and the transfer units 200 are respectively configured to be connected to a plurality of device surfaces 20s of the micro devices 20. In detail, each transfer part 210 has a transferring surface 210s, and each transfer unit 200 is connected to the device surface 20s of a corresponding micro device 20 via the transferring surface 210s of the transfer part 210.

In the present embodiment, area of the transferring surface 210s of each transfer part 210 is smaller than area of the device surface 20s of the corresponding micro device 20, and an orthographic projection of the transferring surface 210s of each transfer part 210 on the carrier 100 completely falls within an orthographic projection of the device surface 20s of the corresponding micro device 20 on the carrier 100.

Herein, a ratio of the area of the transferring surface 210s of each transfer part 210 to the area of the device surface 20s of the corresponding micro device 20 may be greater than or equal to 0.2 and less than 1, thereby providing the micro devices 20 with a sufficient supporting force and preventing each transfer part 210 from contacting a non-corresponding micro device 20. In an embodiment not illustrated, the ratio of the area of the transferring surface of each transfer part to the area of the device surface of the corresponding micro device may be equal to 1, and the disclosure is not limited thereto.

Particularly, as shown in FIG. 2B and FIG. 2C, in an embodiment, the orthographic projection of the transferring surface 210s of each transfer part 210 on the carrier 100 may only partially overlap the orthographic projection of the device surface 20s of the corresponding micro device 20 on the carrier 100. Herein, the transferring surface 210s has a contact surface T with the corresponding device surface 20s. A ratio of area of the contact surface T to the area of the device surface 20s is greater than or equal to 0.2. If less than 0.2, a supporting force of the transfer part 210 with respect to the micro device 20 may become insufficient.

It is to be noted that, each transfer unit 200 has a transfer region TA, and the transfer region TA is a minimum region that covers the orthographic projection of all the transfer parts 210 of each transfer unit 200 on the carrier 100. For example, in the present embodiment, the area of an orthographic projection of the transfer region TA of each transfer unit 200 on the carrier 100 is substantially equal to the area of the transferring surface 210s of the transfer part 210. However, the disclosure is not limited thereto.

In the present embodiment, the area of the orthographic projection of the transfer region TA of each transfer unit 200 on the carrier 100 may selectively be smaller than the area of the device surface 20s of the corresponding micro device 20. However, the disclosure is not limited thereto. For example, in the present embodiment, a ratio of the area of the orthographic projection of the transfer region TA of each transfer unit 200 on the carrier 100 to the area of the device surface 20s of the corresponding micro device 20 is greater than or equal to 0.2 and less than 1. Thus, the carrier structure 10 may provide sufficient supporting forces for the micro devices 20 and each transfer unit 200 can be prevented from contacting a non-corresponding micro device 20. Herein, the dimension of the micro device 20 is, for example, greater than or equal to 20 μm. By a smaller transfer region TA, each transfer unit 200 can be prevented from contacting a non-corresponding micro device 20. However, the disclosure is not limited thereto. In an embodiment not illustrated, the ratio of the area of the transfer region to the area of the device surface of the corresponding micro device may be equal to 1, and the disclosure is not limited thereto.

In the present embodiment, the transfer part 210 of each transfer unit 200 may have viscosity. That is, the material of the transfer part 210 may include a viscous material. The viscous material is, for example, an organic material (e.g., benzocyclobutene, phenol formaldehyde resin, epoxy resin, polyisoprene rubber, or a combination thereof), an inorganic material (e.g., silicon oxide, silicon nitride, silicon oxynitride, or a combination thereof), or a thermally modified material (e.g., a cold brittle material, a hot melt material, a photoresist material, or a combination thereof). Particularly, the viscosity of the viscous material may vary with different temperatures. For example, the higher the temperature, the greater the viscosity of an adhesive. However, the disclosure is not limited thereto. According to other embodiments not illustrated, each transfer part may selectively include a viscous connection layer (not illustrated) disposed on the transferring surface of each transfer part. The viscous connection layer is configured to connect to the device surface 20s of the corresponding micro device 20 and to serve as a buffer during transfer or supporting. Particularly, in the present embodiment, the transferring surface 210s of each transfer part 210 may selectively be aligned with the surface 100s of the carrier 100, such that area of the transfer part 210 of each transfer unit 200 in contact with the carrier 100 is increased, so that the transfer parts 210 may be evenly heated via the carrier 100 to perform a subsequent transfer process. However, the disclosure is not limited thereto.

In the present embodiment, the micro device 20 is, for example, a micro semiconductor device having a photonic function, and examples thereof include a micro light-emitting diode (LED), a micro laser diode, and a micro photodiode. However, the disclosure is not limited thereto. In another embodiment, the micro device 20 may be a micro semiconductor capable of controlling execution of a predetermined electronic function, and examples thereof include a micro diode, a micro transistor, a micro integrated circuit, and a micro sensor. In still another embodiment, the micro device 20 may be a microchip having circuitry, and examples thereof include a microchip using a Si or SOI wafer as a material and for logic or memory applications, or a microchip using a GaAs wafer as a material and for RF communication applications. In the present embodiment, the micro device 20 is, for example, a flip-chip micro semiconductor device. However, the micro device 20 may be a vertical chip micro semiconductor device in an embodiment not illustrated. The disclosure is not limited thereto.

Figure 3A:
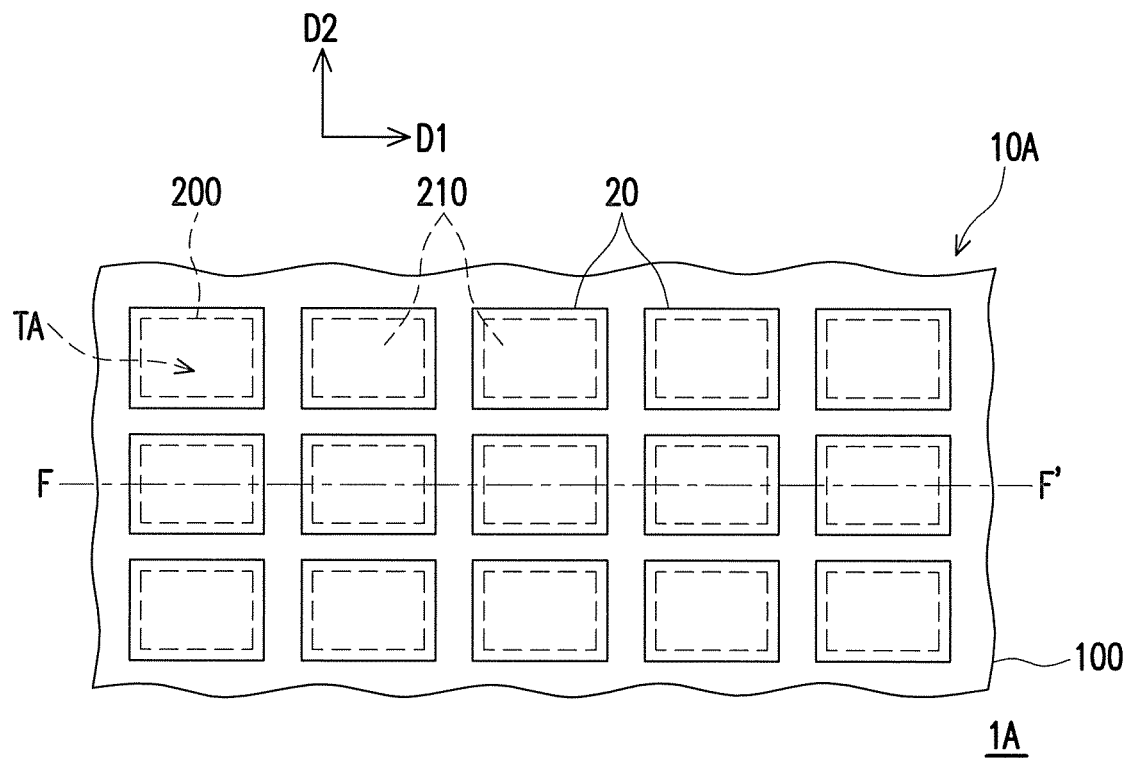
FIG. 3A is a schematic bottom view of a micro device structure according to a second embodiment of the disclosure.
Figure 3B:
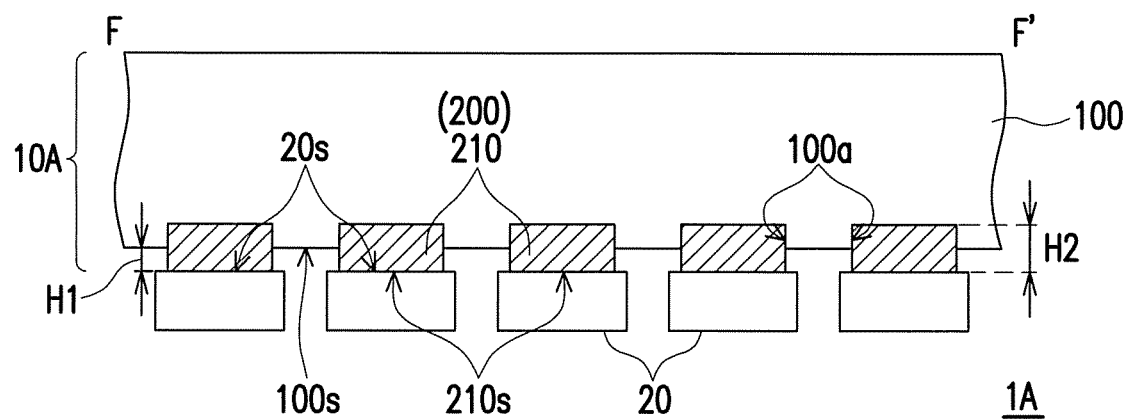
FIG. 3B is a schematic cross-sectional view of the micro device structure of FIG. 3A.

FIG. 3A is a schematic bottom view of a micro device structure according to a second embodiment of the disclosure. FIG. 3B is a schematic cross-sectional view of a micro device structure 1A of FIG. 3A. Referring to FIG. 3A and FIG. 3B, a carrier structure 10A of the present embodiment differs from the carrier structure 10 of FIG. 2A in that, the transferring surface 210s of each transfer part 210 of the carrier structure 10A protrudes from the surface 100s of the carrier 100 (or a level difference exists between the transferring surface 210s of each transfer part 210 and the surface 100s of the carrier 100). In the present embodiment, the Young's modulus of each transfer part 210 may selectively be less than the Young's modulus of the carrier 100 and the Young's modulus of each micro device 20, in order to effectively prevent the micro device 20 from being damaged by being pressed against by the transfer part 210 in a transfer process. That is to say, each transfer part 210 of the carrier structure 10A also has a buffering function. Moreover, since the transferring surface 210s of each transfer part 210 protrudes from the surface 100s of the carrier 100, a buffer space surrounding each transfer part 210 in a bonding process during transfer can be increased. Particularly, the transferring surface 210s protrudes from the surface 100s of the carrier 100 by a height H1, and a ratio of the height H1 to a height H2 of each transfer part 210 is less than or equal to 0.8. If greater than 0.8, the supporting force of the transfer part 210 with respect to the micro device 20 may become insufficient, and the micro device 20 may easily be damaged by being pressed against by the transfer part 210 in the transfer process.

FIG. 4A to FIG. 4E schematically illustrate a process of using the carrier structure 10 of FIG. 2A and the carrier structure 10A of FIG. 3B to transfer the micro device 20. Particularly, in the transfer process of the micro device 20, the carrier structure 10 of FIG. 2A may be used as a transfer apparatus 12 for transferring the micro device 20, and the carrier structure 10A of FIG. 3B may be used as a temporary substrate 11 for placing the micro device 20 thereon. However, the disclosure is not limited thereto.

Figure 4A:
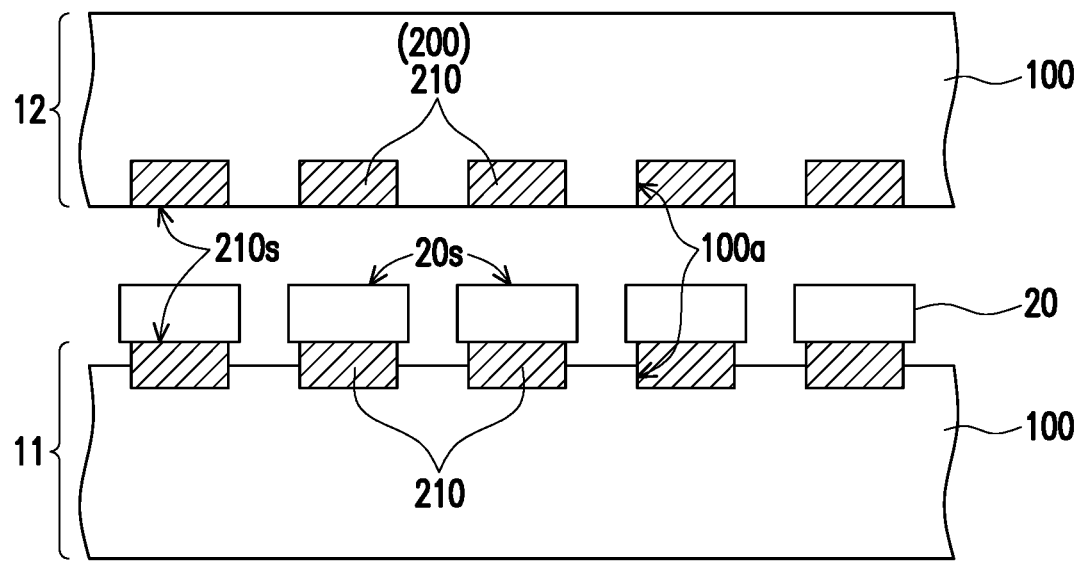
FIG. 4A to FIG. 4E schematically illustrate a process of using a carrier structure of FIG. 2A and a carrier structure of FIG. 3B to transfer micro devices.
Figure 4B:
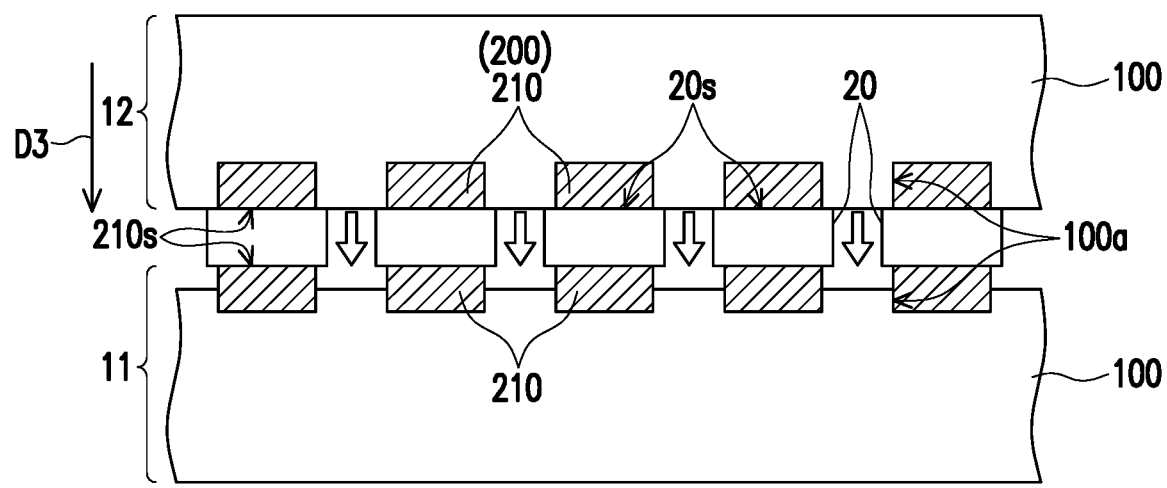

Referring to FIG. 4A, first, the temporary substrate 11 and a plurality of micro devices 20 are provided, wherein the micro devices 20 are arranged in an array on the temporary substrate 11, and each micro device 20 is connected to the transferring surface 210s of the transfer part 210 of the corresponding transfer unit 200 of the temporary substrate 11. The transfer apparatus 12 is provided, wherein each transfer part 210 of the transfer apparatus 12 corresponds to one micro device 20. In an embodiment not illustrated, the transfer units of the transfer apparatus may selectively be configured to be separated from each other by one micro device 20 therebetween so as to connect two nonadjacent micro devices 20. However, the disclosure is not limited thereto. In this way, selective transfer requirements of a plurality of micro devices can be satisfied. Referring to FIG. 4B, next, the transfer apparatus 12 is moved closer to the temporary substrate 11 in a direction D3, so that the transfer apparatus 12 is connected to the device surfaces 20s of the micro devices 20 via the transfer parts 210, respectively. Specifically, each transfer unit 210 of the transfer apparatus 12 is connected to the device surface 20s of a corresponding micro device 20 via the transferring surface 210s. Herein, the temporary substrate 11 may be a temporary substrate such as a sapphire substrate, a glass substrate or a plastic substrate, and may have no operating circuits thereon and serve as a temporary carrier for supporting the micro devices 20. However, the disclosure is not limited thereto.

Figure 4C:
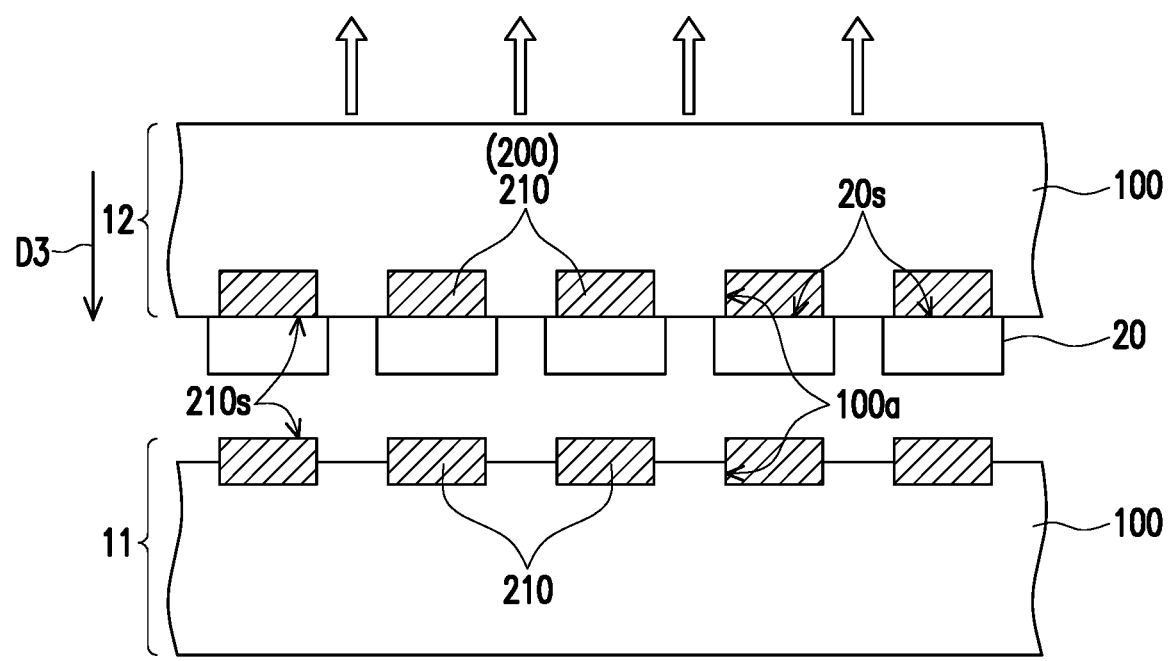

For example, when a plurality of transfer parts 210 of the transfer apparatus 12 are respectively connected to the device surfaces 20s of the micro devices 20, the transfer parts 210 of the transfer units 200 may selectively be heated, thereby increasing the viscosity of the transferring surface 210s of each transfer part 210 connected to the device surface 20s of the micro device 20, such that adhesion force of each transfer part 210 is improved. In the disclosure, since the transfer part 210 is disposed in the recess, the transfer part 210 can be uniformly heated during heating. Referring to FIG. 4C, next, the carrier 100 of the transfer apparatus 12 is moved away from the temporary substrate 11 in a direction opposite the direction D3, and the micro devices 20 are moved away from the temporary substrate 11 through the transfer parts 210.

Figure 4D:
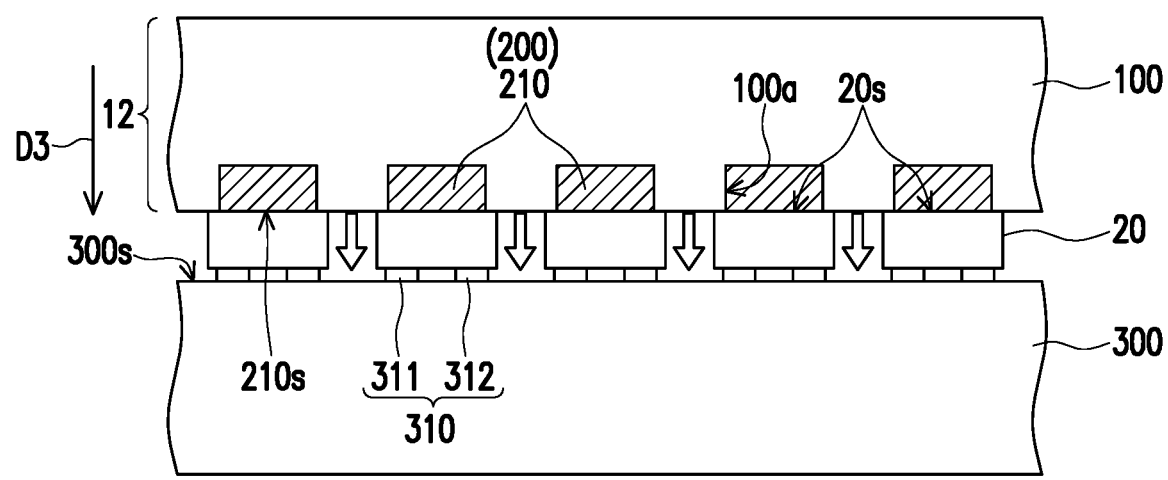

Referring to FIG. 4D, next, a target substrate 300 is provided, and the carrier 100 of the transfer apparatus 12 is moved closer to the target substrate 300 in the direction D3, so that the micro devices 20 are bonded to the target substrate 300. The target substrate 300 is, for example, a pixel array substrate for display, and has a plurality of bonding pad sets 310 arranged in an array on a surface 300s of the target substrate 300. In detail, each bonding pad set 310 includes a first bonding pad 311 and a second bonding pad 312, and a first electrode (not illustrated) and a second electrode (not illustrated) of each micro device 20 (e.g., a micro LED) are respectively bonded to the first bonding pad 311 and the second bonding pad 312 of the target substrate 300. However, the disclosure is not limited thereto. According to other embodiments, the target substrate 300 may be a printed circuit board (PCB), a display substrate, a light-emitting substrate, a substrate having a functional element such as a thin film transistor or an integrated circuit (IC), or other type of circuit substrate, but is not limited thereto.

Figure 4E:
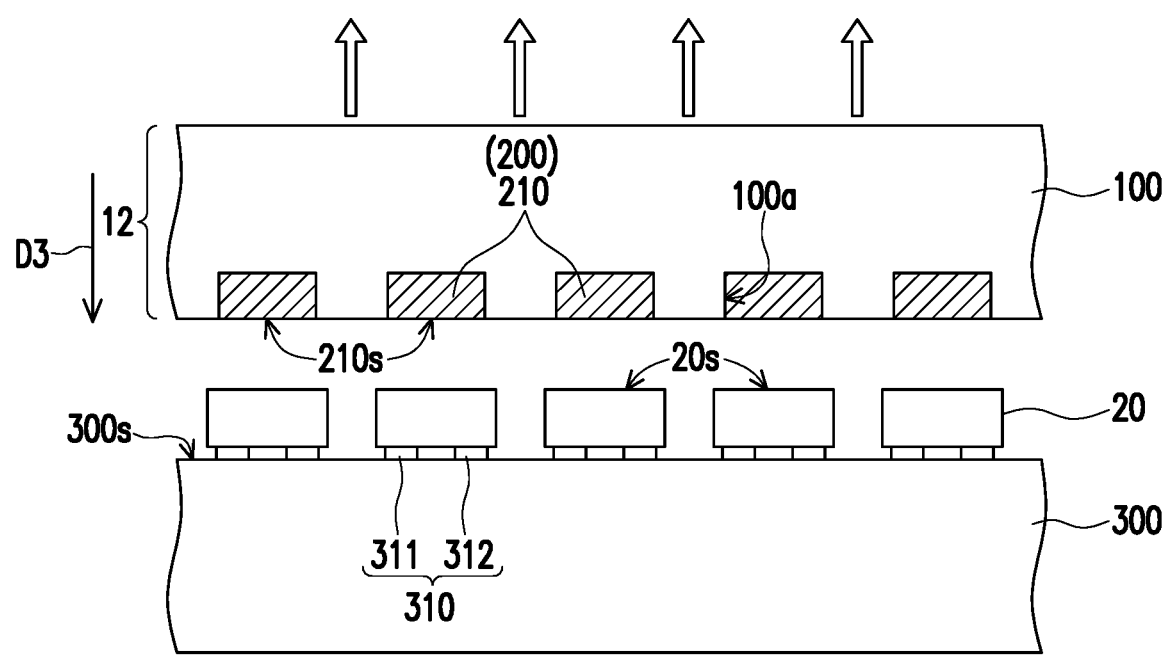

Referring to FIG. 4E, after each micro device 20 is bonded to the target substrate 300, the carrier 100 of the transfer apparatus 12 is moved away from the target substrate 300 in a direction opposite the direction D3, so that the transfer parts 210 are respectively separated from the micro devices 20. Up to this step, the transfer process of the micro devices 20 has been completed.

Figure 5:
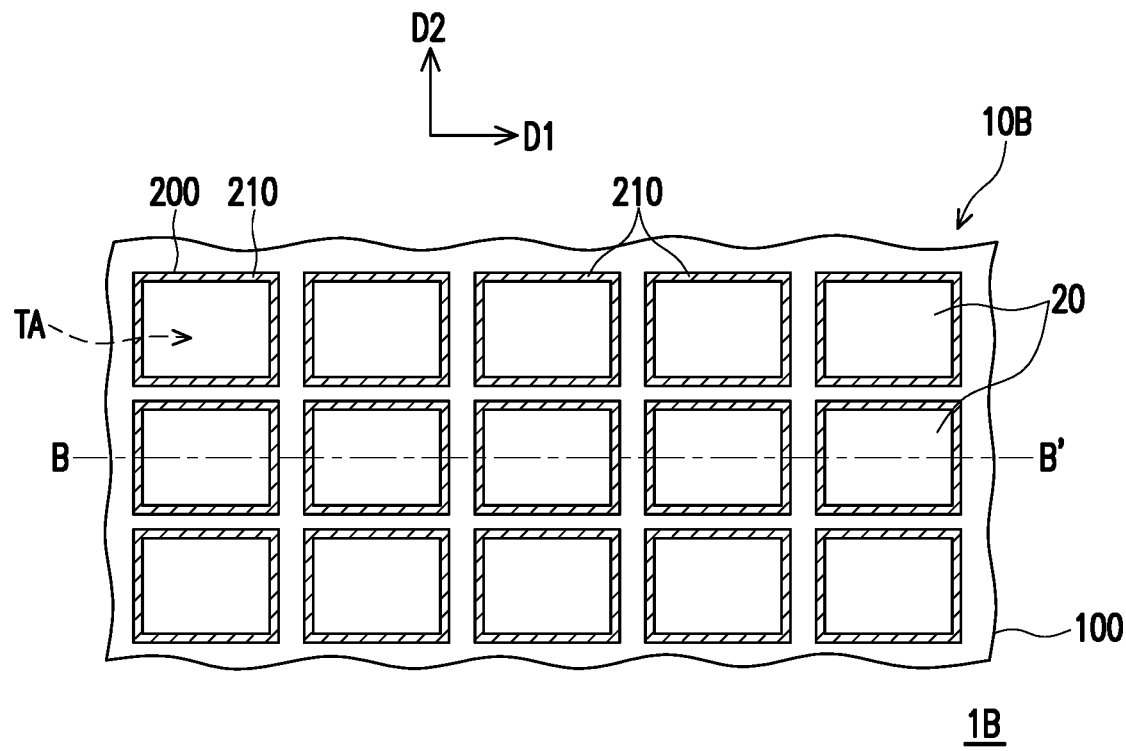
FIG. 5 is a schematic bottom view of a micro device structure according to a third embodiment of the disclosure.
Figure 6:
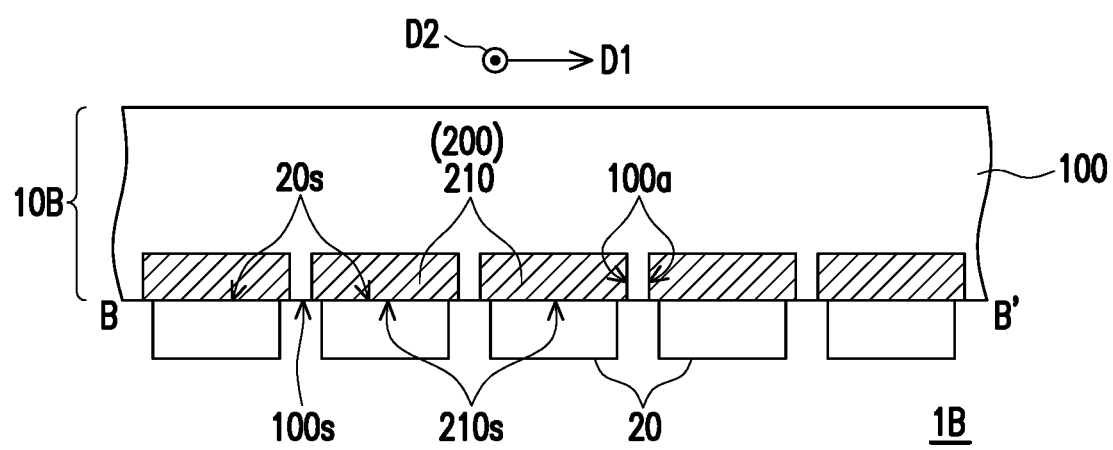
FIG. 6 is a schematic cross-sectional view of the micro device structure of FIG. 5.

FIG. 5 is a schematic bottom view of a micro device structure 1B according to a third embodiment of the disclosure. FIG. 6 is a schematic cross-sectional view of the micro device structure 1B of FIG. 5. Particularly, FIG. 6 corresponds to a section line B-B' of FIG. 5.

Referring to FIG. 5 and FIG. 6, the micro device structure 1B of the present embodiment differs from the micro device structure 1 of FIG. 1 in that, the area of the transferring surface 210s of each transfer part 210 of the micro device structure 1B is larger than the area of the device surface 20s of the corresponding micro device 20, and the orthographic projection of the device surface 20s of each micro device 20 on the carrier 100 completely falls within the orthographic projection of the transferring surface 210s of each corresponding transfer part 210 on the carrier 100. A ratio of the area of the transfer part 210 of each transfer unit 200 of the carrier structure 10B to the area of the device surface 20s of the corresponding micro device 20 is greater than 1 and less than or equal to 1.5, thereby increasing a misalignment latitude (e.g., the misalignment in the direction D2 and/or the direction D1) of the carrier structure 10B in the transfer process, and preventing each transfer unit 200 from occupying excessive space of the carrier 100. Herein, the dimension of the micro device 20 is, for example, less than or equal to 20 μm, and a greater misalignment latitude is required. However, the disclosure is not limited thereto.

Figure 7A:
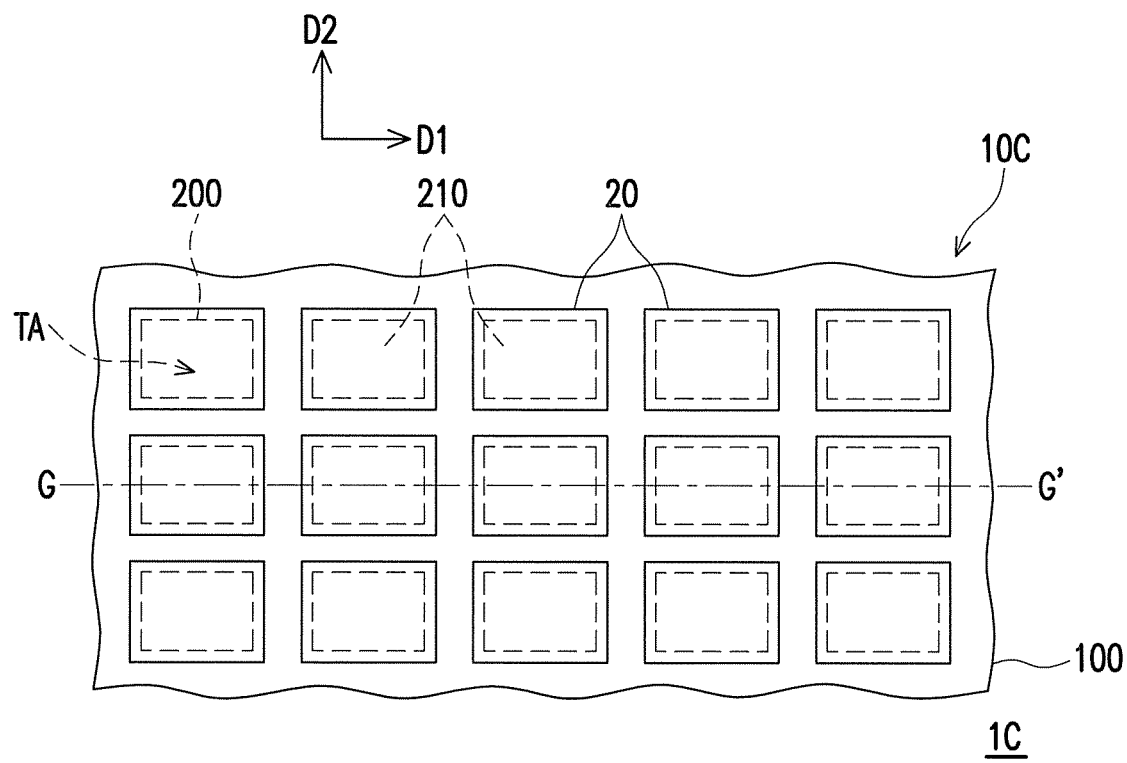
FIG. 7A is a schematic bottom view of a micro device structure according to a fourth embodiment of the disclosure.
Figure 7B:
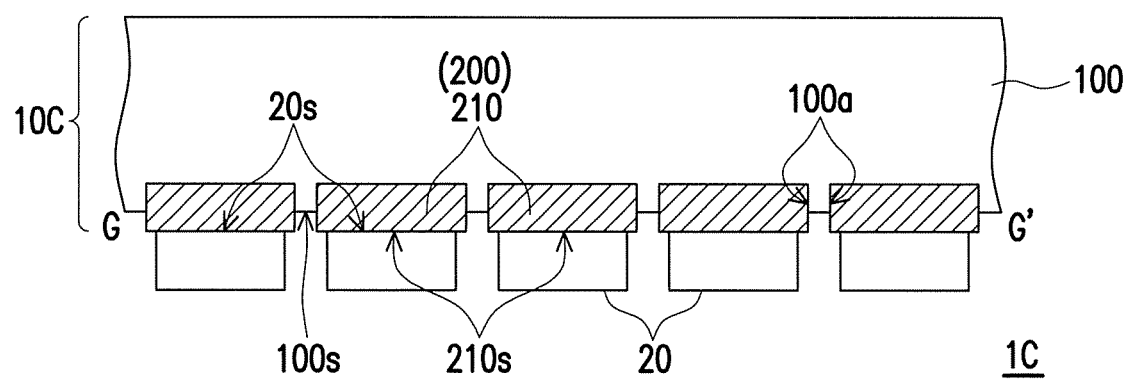
FIG. 7B is a schematic cross-sectional view of the micro device structure of FIG. 7A.

FIG. 7A is a schematic bottom view of a micro device structure according to a fourth embodiment of the disclosure. FIG. 7B is a schematic cross-sectional view of a micro device structure 1C of FIG. 7A. Referring to FIG. 7A and FIG. 7B, the micro device structure 1C of the present embodiment differs from the micro device structure 1B of FIG. 6 in that, the transferring surface 210s of each transfer part 210 of the micro device structure 1C protrudes from the surface 100s of the carrier 100 (or a level difference exists between the transferring surface 210s of each transfer part 210 and the surface 100s of the carrier 100). In addition, in the present embodiment, the Young's modulus of each transfer part 210 may selectively be less than the Young's modulus of the carrier 100 and the Young's modulus of each micro device 20, in order to effectively prevent the micro device 20 from being damaged by being pressed against by the transfer part 210 in the transfer process. That is to say, each transfer part 210 of the carrier structure 10C also has the buffering function; moreover, the transferring surface 210s of each transfer part 210 protrudes from the surface 100s of the carrier 100, thereby increasing the buffer space surrounding each transfer part 210 in the bonding process during transfer.

Figure 8:
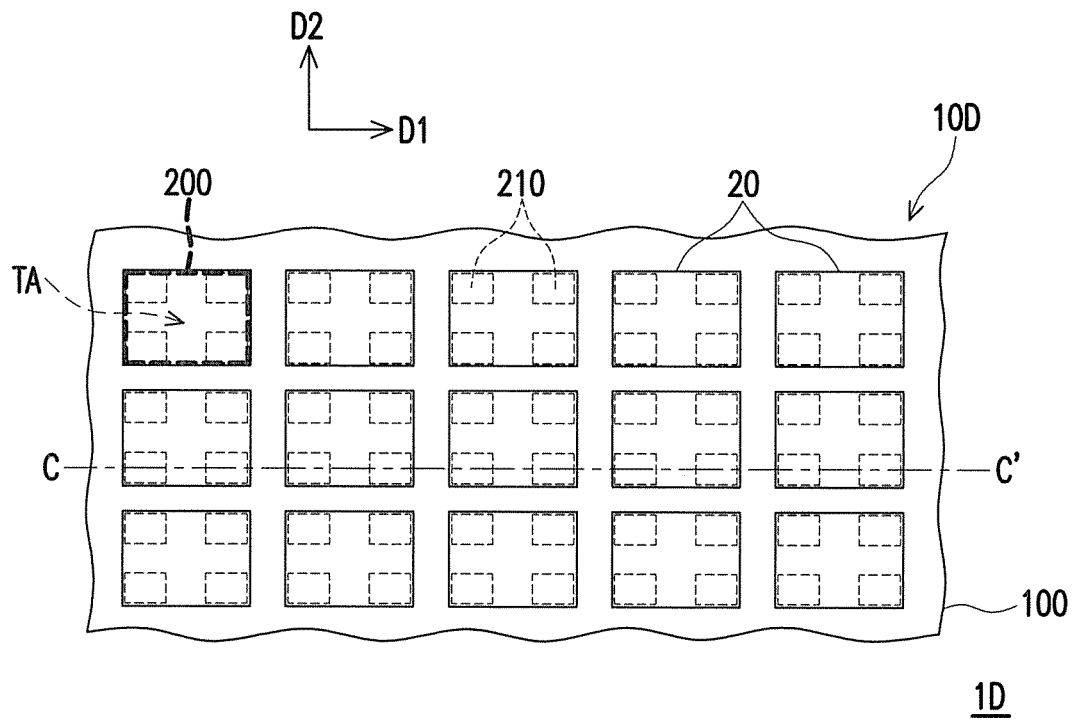
FIG. 8 is a schematic bottom view of a micro device structure according to a fifth embodiment of the disclosure.
Figure 9:
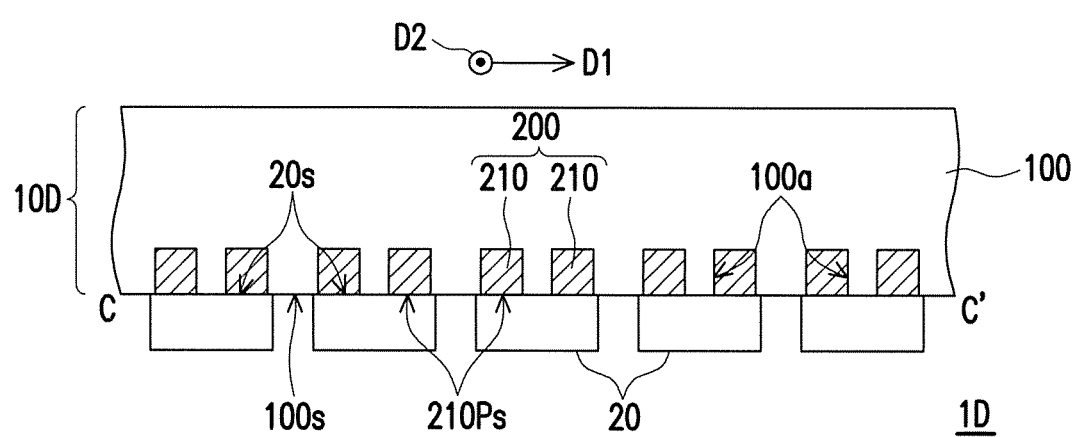
FIG. 9 is a schematic cross-sectional view of the micro device structure of FIG. 8.

FIG. 8 is a schematic bottom view of a micro device structure 1D according to a fifth embodiment of the disclosure. FIG. 9 is a schematic cross-sectional view of the micro device structure 1D of FIG. 8. Particularly, FIG. 9 corresponds to a section line C-C' of FIG. 8.

Referring to FIG. 8 and FIG. 9, the micro device structure 1D of the present embodiment differs from the micro device structure 1 of FIG. 1 in that, each transfer unit 200 of the micro device structure 1D has a plurality of transfer parts 210. Particularly, by adjusting the size and distribution density of the transfer part 210 of each transfer unit 200 (or the recess 100a of the carrier 100), the connection force between each transfer unit 200 of the micro device structure 1D and the micro device 20 can be changed in magnitude to satisfy different supporting requirements. For example, when the surface of the micro device is a smooth surface, the distribution density of the transfer parts 210 is smaller, such that the micro device can be effectively supported and can be transferred more easily and efficiently. When the surface of the micro device is uneven, the distribution density of the transfer parts 210 is greater, such that the connection force received by the micro device can be more uniform in the transfer process.

In the present embodiment, a sub transferring surface 210Ps of each transfer part 210 in each transfer unit 200 is smaller than the device surface 20s of the corresponding micro device 20, and the ratio therebetween is greater than or equal to 0.2 and less than 0.8. Thus, the micro devices 20 can receive a more sufficient support force. It is to be noted that the ratio of the area of the transfer region TA formed by the orthographic projection of all the transfer parts 210 of each transfer unit 200 on the carrier 100 to the area of the device surface 20s of the corresponding micro device 20 is greater than or equal to 0.2 and less than or equal to 1, such that the micro devices 20 can receive a more uniform supporting force, and each transfer unit 200 can be prevented from contacting a non-corresponding micro device 20. However, the disclosure is not limited thereto. Herein, the dimension of the micro device 20 is, for example, greater than or equal to 20 μm. By a smaller transfer region TA, each transfer unit 200 can be prevented from contacting a non-corresponding micro device 20. However, the disclosure is not limited thereto.

Figure 10:
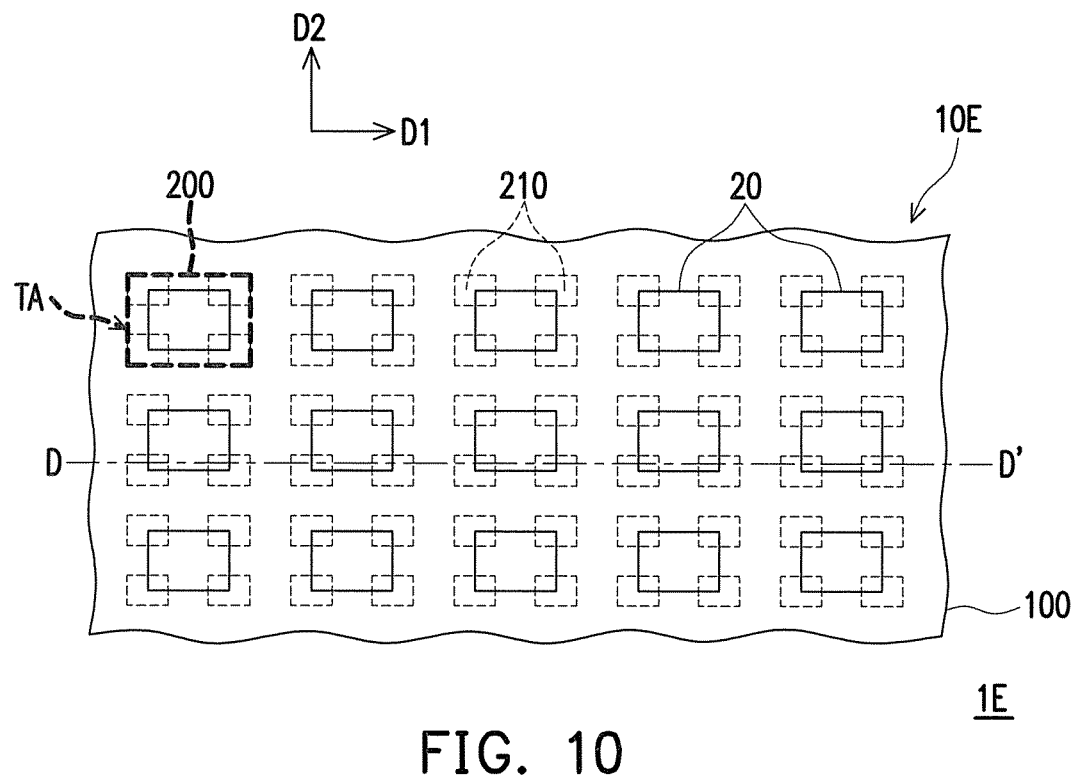
FIG. 10 is a schematic bottom view of a micro device structure according to a sixth embodiment of the disclosure.
Figure 11:
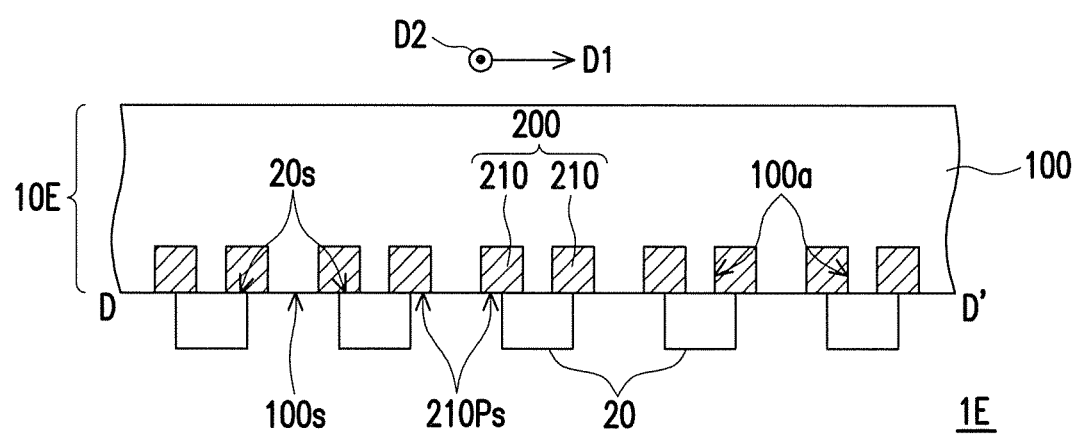
FIG. 11 is a schematic cross-sectional view of the micro device structure of FIG. 10.

FIG. 10 is a schematic bottom view of a micro device structure 1E according to a sixth embodiment of the disclosure. FIG. 11 is a schematic cross-sectional view of the micro device structure 1E of FIG. 10. Particularly, FIG. 11 corresponds to a section line D-D' of FIG. 10.

Referring to FIG. 10 and FIG. 11, the micro device structure 1E of the present embodiment differs from the micro device structure 1D of FIG. 8 in that, the area of the transfer region TA formed by the orthographic projection of all the transfer parts 210 of each transfer unit 200 of the micro device structure 1E on the carrier 100 is larger than the area of the device surface 20s of the corresponding micro device 20. Particularly, in the present embodiment, since a ratio of the area of the orthographic projection of the transfer region TA of each transfer unit 200 on the carrier 100 to the area of the device surface 20s of the corresponding micro device 20 is greater than 1 and less than or equal to 1.5, a misalignment latitude (e.g., the misalignment in the direction D2 and/or the direction D1) of the carrier structure 10E in the transfer process can be increased, and each transfer unit 200 can be prevented from occupying excessive space of the carrier 100. Herein, the dimension of the micro device 20 is, for example, less than or equal to 20 μm, and a greater misalignment latitude is required. However, the disclosure is not limited thereto.

Figure 12A:
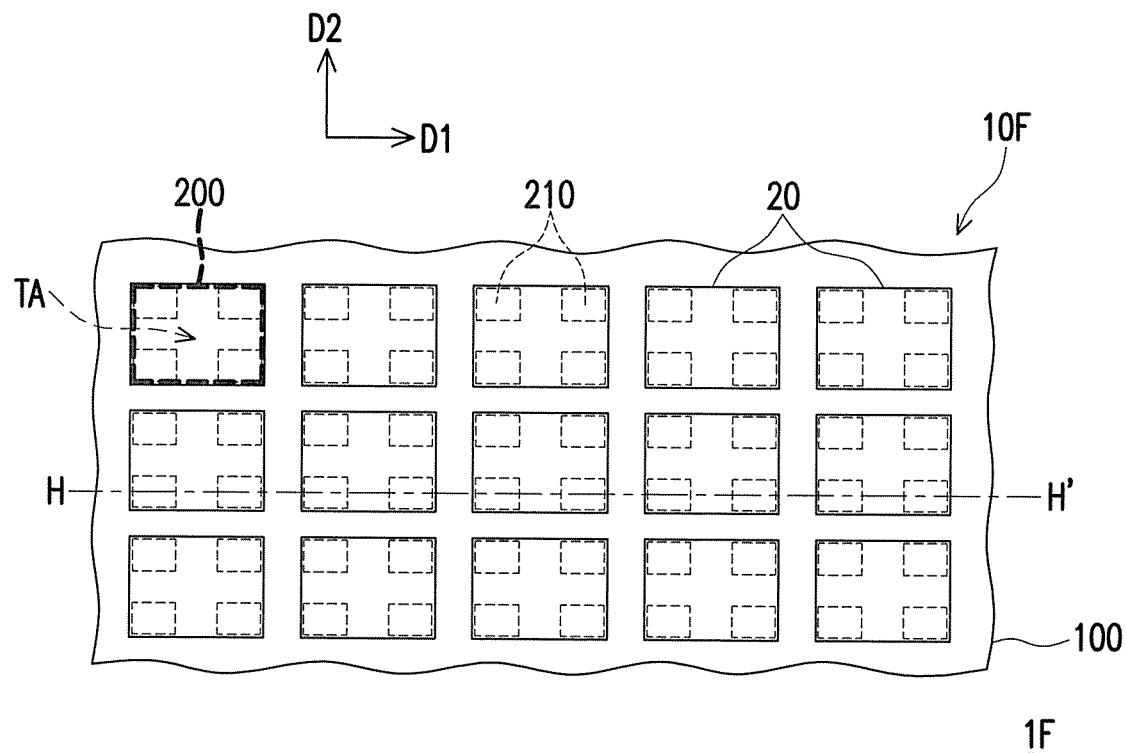
FIG. 12A is a schematic bottom view of a micro device structure according to a seventh embodiment of the disclosure.
Figure 12B:
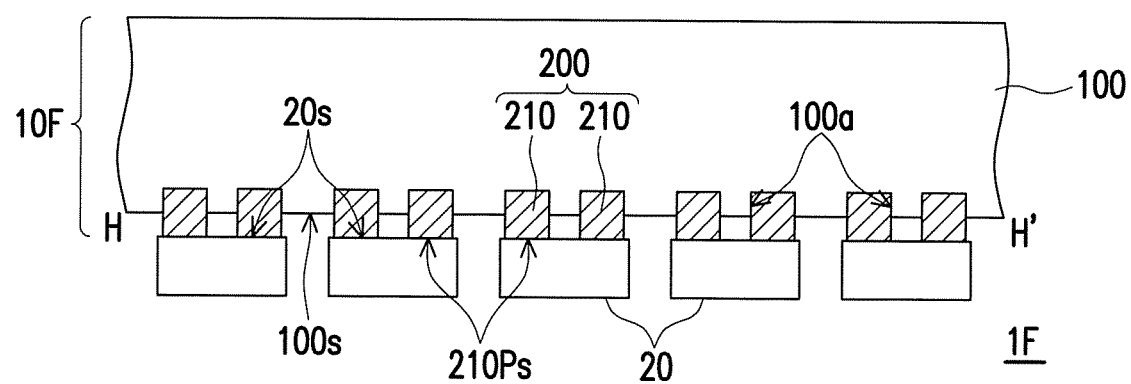
FIG. 12B is a schematic cross-sectional view of the micro device structure of FIG. 12A.

FIG. 12A is a schematic bottom view of a micro device structure according to a seventh embodiment of the disclosure. FIG. 12B is a schematic cross-sectional view of a micro device structure 1F of FIG. 12A. Referring to FIG. 12A and FIG. 12B, the micro device structure 1F of the present embodiment differs from the micro device structure 1D of FIG. 9 in that, the sub transferring surface 210Ps of each transfer part 210 of the micro device structure IF protrudes from the surface 100s of the carrier 100 (or a level difference exists between the sub transferring surface 210Ps of each transfer part 210 and the surface 100s of the carrier 100). In addition, in the present embodiment, the Young's modulus of each transfer part 210 may selectively be less than the Young's modulus of the carrier 100 and the Young's modulus of each micro device 20, in order to effectively prevent the micro device 20 from being damaged by being pressed against by the transfer part 210 in the transfer process. That is to say, each transfer part 210 of the carrier structure 10F also has the buffering function; moreover, the sub transferring surface 210Ps of each transfer part 210 protrudes from the surface 100s of the carrier 100, thereby increasing the buffer space surrounding each transfer part 210 in the bonding process during transfer.

It is worth mentioning that, in the transfer process of the micro device 20, the carrier structures 10 to 10F of the above embodiments may be arbitrarily configured according to process requirements, so as to achieve an optimal transfer yield. For example, in a configuration combination, the carrier structure 10C of the fourth embodiment may serve as a transfer apparatus, and the carrier structure 10F of the seventh embodiment may serve as a temporary substrate, so as to satisfy the transfer requirements of a larger micro device. In another configuration combination, the carrier structure 10A of the second embodiment may serve as a transfer apparatus, and the carrier structure 10F of the seventh embodiment may serve as a temporary substrate, so as to satisfy the transfer requirements of a micro device that is smaller in size and vulnerable to external forces.

In summary, in the carrier structure and the micro device structure of the embodiments of the disclosure, by disposing the transfer unit in the corresponding recess of the carrier, the transfer unit can be uniformly heated, so as to improve transfer (or supporting) uniformity and the supporting force of the carrier structure with respect to a plurality of micro devices.

Although the disclosure has been described with reference to the above examples, it will be apparent to one of ordinary skill in the art that modifications to the described examples may be made without departing from the spirit of the disclosure. Accordingly, the scope of the disclosure will be defined by the attached claims and not by the above detailed descriptions.

What is claimed is:

1. A micro device structure, comprising:
   a carrier structure, comprising:
   a carrier having a carrier surface and a plurality of recesses, the recesses being located on the carrier surface of the carrier; and
   a plurality of transfer units, wherein the transfer units are respectively disposed in the recesses; and
   a plurality of micro devices, wherein each of the micro devices has a device surface, and a transferring surface of each of the transfer units is connected to the device surface of only one corresponding micro device, and the micro devices each overlap only one of the recesses.

2. The micro device structure according to claim 1, wherein the transferring surface is aligned with the carrier surface.

3. The micro device structure according to claim 1, wherein the transferring surface protrudes from the carrier surface.

4. The micro device structure according to claim 3, wherein a ratio of a height by which the transferring surface protrudes from the carrier surface to a height of the each of the transfer units is greater than 0 and less than or equal to 0.8.

5. The micro device structure according to claim 1, wherein a Young's modulus of the each of the transfer units is less than a Young's modulus of the carrier and a Young's modulus of the corresponding micro device.

6. The micro device structure according to claim 1, wherein a ratio of area of the transferring surface of the each of the transfer units to area of the device surface of the corresponding micro device is greater than or equal to 0.2 and less than or equal to 1.5.

7. The micro device structure according to claim 6, wherein the transferring surface of the each of the transfer units has a contact surface with the device surface of the corresponding micro device, and a ratio of area of the contact surface to the area of the device surface is greater than or equal to 0.2 and less than 1.

8. The micro device structure according to claim 1, wherein the each of the transfer units comprises a plurality of transfer parts.

9. The micro device structure according to claim 8, wherein each of the transfer parts comprises a sub transferring surface connected to the device surface of the corresponding micro device, and each of the sub transferring surface is smaller than the device surface of the corresponding micro device.

10. The micro device structure according to claim 9, wherein an orthographic projection of the transfer parts of the each of the transfer units on the carrier is defined as a transfer region, and a ratio of area of the transfer region to area of the device surface of the corresponding micro device is greater than or equal to 0.2 and less than or equal to 1.5.

11. The micro device structure according to claim 1, wherein a ratio of a spacing between any two adjacent recesses to a width of the each of the micro devices is greater than 0 and less than or equal to 0.5.

12. A carrier structure suitable for transferring or supporting a plurality of micro devices, the carrier structure comprising:
 a carrier having a carrier surface and a plurality of recesses, the recesses being located on the carrier surface of the carrier; and
 a plurality of transfer units, wherein the transfer units are respectively disposed in the recesses and each expose a transferring surface, each of the micro devices has a device surface, and the transferring surface of each of the transfer units is configured to be connected to the device surface of only one corresponding micro device, and the micro devices each overlap only one of the recesses.

13. The carrier structure according to claim 12, wherein the transferring surface is aligned with the carrier surface.

14. The carrier structure according to claim 12, wherein the transferring surface protrudes from the carrier surface.

15. The carrier structure according to claim 14, wherein a ratio of a height by which the transferring surface protrudes from the carrier surface to a height of the each of the transfer units is greater than 0 and less than or equal to 0.8.

16. The carrier structure according to claim 12, wherein a ratio of a spacing between any two adjacent recesses to a width of the each of the micro devices is greater than 0 and less than or equal to 0.5.

* * * * *